(12) United States Patent
Keller et al.

(10) Patent No.: US 8,367,303 B2
(45) Date of Patent: Feb. 5, 2013

(54) SEMICONDUCTOR DEVICE FABRICATION AND DRY DEVELOP PROCESS SUITABLE FOR CRITICAL DIMENSION TUNABILITY AND PROFILE CONTROL

(75) Inventors: David J. Keller, Boise, ID (US); Alex Schrinsky, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 236 days.

(21) Appl. No.: 11/487,246

(22) Filed: Jul. 14, 2006

(65) Prior Publication Data

US 2008/0014533 A1 Jan. 17, 2008

(51) Int. Cl.
G03F 7/26 (2006.01)
(52) U.S. Cl. ........................................ 430/313
(58) Field of Classification Search ................... 430/311, 430/313
See application file for complete search history.

(56) References Cited

U.S. PATENT DOCUMENTS

| | | | |
|---|---|---|---|
| 6,040,248 A * | 3/2000 | Chen et al. | 438/725 |
| 6,080,678 A * | 6/2000 | Yim | 438/725 |
| 6,527,966 B1 | 3/2003 | Shimomura et al. | |
| 6,617,257 B2 | 9/2003 | Ni et al. | |
| 6,746,961 B2 | 6/2004 | Ni et al. | |
| 6,797,552 B1 * | 9/2004 | Chang et al. | 438/197 |
| 6,858,542 B2 | 2/2005 | Sparks et al. | |
| 2002/0195416 A1 * | 12/2002 | Nallan | 216/2 |
| 2003/0027059 A1 * | 2/2003 | Schweeger | 430/5 |
| 2004/0018738 A1 * | 1/2004 | Liu | 438/700 |
| 2004/0060659 A1 * | 4/2004 | Morioka et al. | 156/345.26 |
| 2005/0133479 A1 * | 6/2005 | Youngner et al. | 216/41 |
| 2005/0164478 A1 | 7/2005 | Chan et al. | |
| 2005/0202683 A1 | 9/2005 | Wang et al. | |
| 2006/0040504 A1 | 2/2006 | Crawford et al. | |
| 2008/0197109 A1 | 8/2008 | Mui et al. | |

* cited by examiner

Primary Examiner — Brittany Raymond
(74) Attorney, Agent, or Firm — TraskBritt

(57) ABSTRACT

The critical dimension (CD) of features formed during the fabrication of a semiconductor device may be controlled through the use of a dry develop chemistry comprising $O_2$, $SO_2$ and a hydrogen halide. For example, a dry develop chemistry comprising a gas comprising $O_2$ and a gas comprising $SO_2$ and a gas comprising HBr may be used to remove exposed areas of a carbon-based mask. The addition of HBr to the conventional $O_2$ and $SO_2$ dry develop chemistry enables a user to tune the critical dimension by growing, trimming and/or sloping the sidewalls and to enhance sidewall passivation and reduce sidewall bowing.

29 Claims, 14 Drawing Sheets

SEMICONDUCTOR DEVICE FABRICATION AND DRY DEVELOP PROCESS SUITABLE FOR CRITICAL DIMENSION TUNABILITY AND PROFILE CONTROL

BACKGROUND OF THE INVENTION

1. Field of the Invention

The present invention relates to semiconductor fabrication processes and, more particularly, to dry develop processes with improved tunability of critical dimensions during semiconductor fabrication.

2. State of the Art

A common process requirement in semiconductor device fabrication is the removal of material layers or films to form features of a semiconductor device. For example, semiconductor fabrication may include the etching and formation of structures and openings such as trenches, contacts and vias in the material layers overlying conductive or semiconductive substrates. The patterning and formation of such structures is generally accomplished through the use of a patterned photolithographic mask and often, a hard mask or resist.

During semiconductor fabrication, it is preferable for sidewalls of the mask and resist used to define desired features to remain perpendicular to the surface of the underlying substrate. However, as feature dimensions are ever-decreasing and desired feature densities are ever-increasing, it is more and more difficult to create complex circuit structures on a small size chip using conventional etching processes. For example, as the size of the photoresist or photomask patterns are reduced, the thickness of the photomask must also decrease, in order to control pattern resolution in the underlying layers. The thinner photomask is not very rigid and may be eroded away during the etching process, which may lead to sidewall bowing (i.e., concave sidewalls) in the photomask and to poor line and profile control, as well as loss of the critical dimension of the mask and underlying substrate.

One approach to solve this problem of mask erosion is to include an antireflective coating (ARC) beneath the photomask. The ARC is formed over the substrate layers to be etched to prevent non-uniform reflection of radiation during the patterning of the photomask and, thus, inhibit defects in the photomask. Subsequently, the ARC may be etched using the photomask layer as a mask to remove those layers of the ARC which correspond to the openings in the photomask. However, even with the use of an ARC, there may still be lateral etching and sidewall bowing using conventional etching processes.

In another approach to the mask erosion problem, a carbon-based mask may be formed above an underlying semiconductor substrate and beneath the photomask and/or ARC as an etch-stop layer in order to improve the fidelity of the masking layers during etching of the underlying substrate layers. The carbon-based mask is more rigid and etch resistant than the photomask layer, thus providing for good etch selectivity for fabrication of openings in the semiconductor device.

Conventional plasma dry etch gas chemistries include $CHF_3+CF_4+O_2+Ar$, $N_2+He+O_2$, $N_2+O_2$, $N_2+He$, $O_2+CO_2$, $O_2+SO_2$, and $C_2F_6+Ar$. This type of plasma etching is called a "dry develop" process. Dry develop process chemistries, such as $O_2+SO_2$, are known in the art and work well, as they give good selectivity to the mask material and the underlying layer. However, conventional dry develop process chemistries lack sufficient ability to tune the critical dimension (CD) of the mask by preferentially growing, trimming or slanting the sidewall profile of a carbon-based mask. Furthermore, when the critical dimension of the mask falls below 120 nm, it becomes advantageous or even necessary to use advanced patterning and etching techniques. The critical dimension of a mask includes the profile and dimensions of the features of a mask such as the dimensions of the patterned solid regions as well as the dimensions of the exposed and removed areas of the mask. For example, it may be advantageous to grow (i.e., add material to), to trim (i.e., remove material from) and/or slant a surface defining a critical dimension of the carbon-based mask and, as such, tune the critical dimension thereof.

Therefore, there is a need for a dry develop process providing the ability to tune and control critical dimensions of a carbon-based mask during the fabrication of semiconductor devices.

BRIEF DESCRIPTION OF THE SEVERAL VIEWS OF THE DRAWINGS

While the specification concludes with claims particularly pointing out and distinctly claiming that which is regarded as the present invention, the features and advantages of the claimed invention can be more readily ascertained from the following description of the invention when read in conjunction with the accompanying drawings in which:

DETAILED DESCRIPTION OF THE INVENTION

Reference will now be made in detail to various embodiments of a method of fabricating a semiconductor device, examples of which are illustrated in the accompanying drawings. Although the following description refers to the illustrated embodiments, it is to be understood that these embodiments are presented by way of example and not by way of limitation. The following detailed description encompasses such modifications, alternatives, and equivalents as may fall within the spirit and scope of the invention as defined by the claims.

It is to be understood that the processes described herein do not cover a complete process flow for the fabrication of a semiconductor device. Processes that incorporate teachings of the present invention may be practiced with various semiconductor device fabrication techniques that are conventionally used in the art, and only so much of the commonly practiced process acts are included herein as are necessary or desirable to provide an understanding of the present invention. Thus, for example, the following description does not address the interconnection of the transistors formed or other subsequent processing, generally referred to as "back end" processing.

Figure 1A:
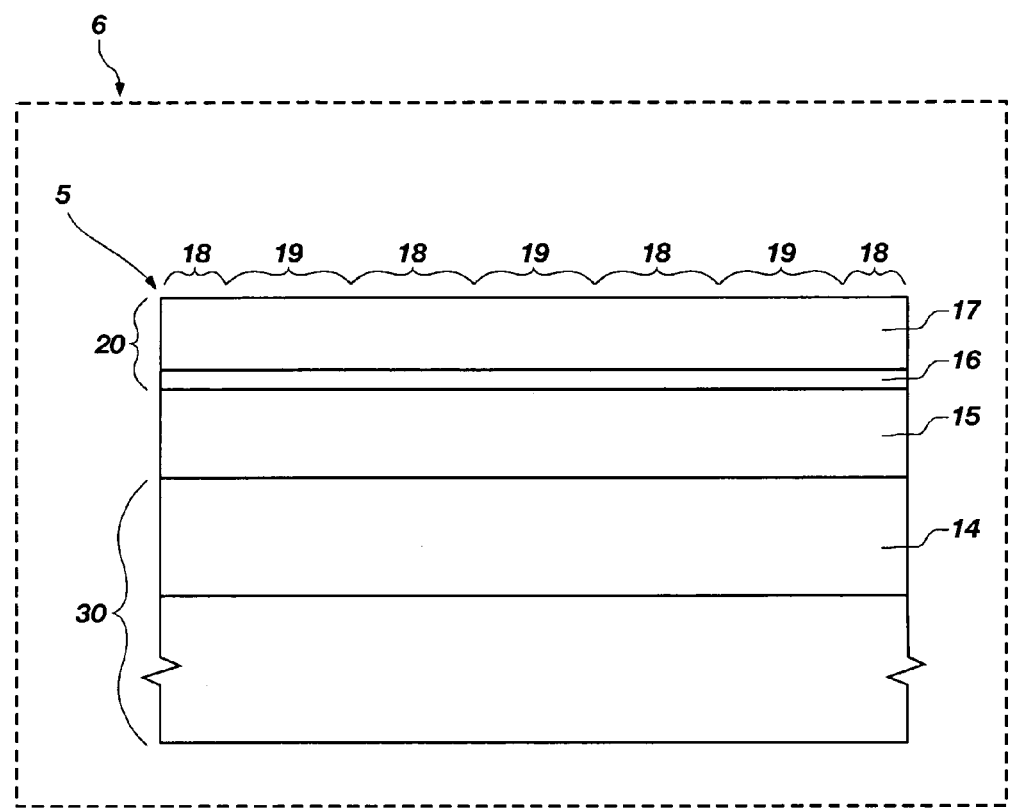
FIGS. 1a and 1b illustrate a cross-sectional view of a semiconductor substrate covered with a carbon-based mask and an initial mask structure.
Figure 1B:
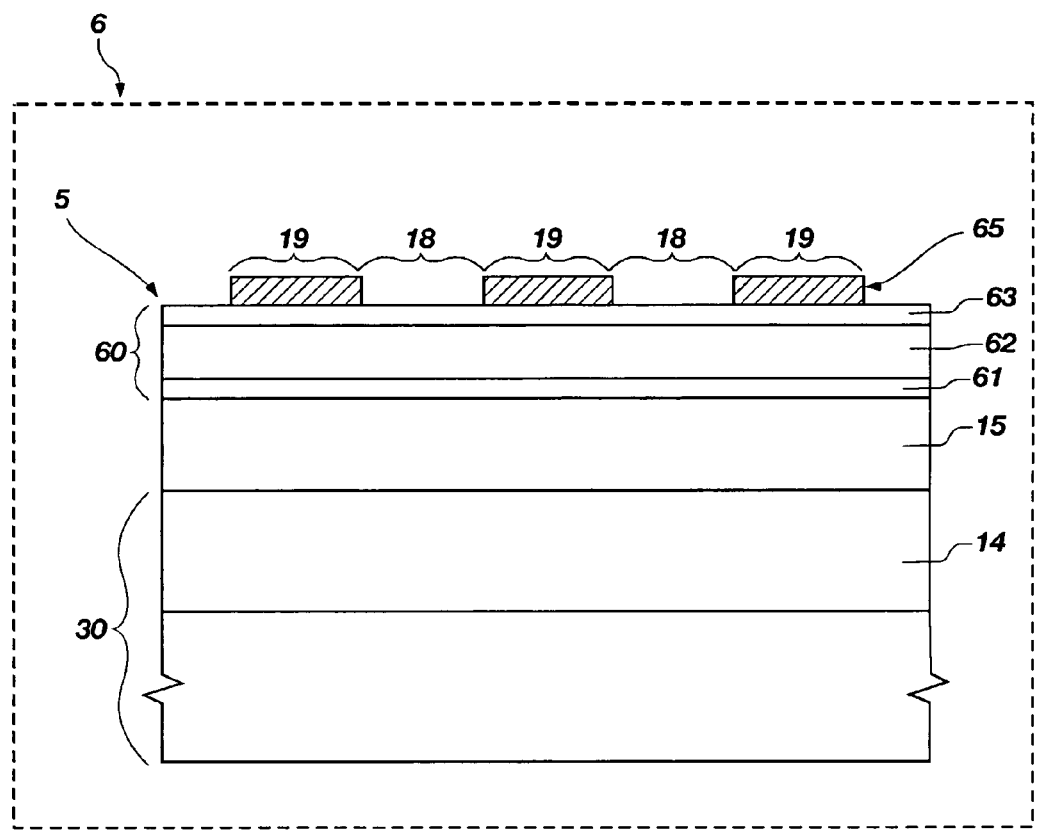

In one aspect, the invention includes methods of tuning the critical dimension of semiconductor device features formed during the semiconductor fabrication process. The methods may include the use of a dry develop chemistry comprising $O_2$, $SO_2$ and a hydrogen halide. The methods may further include supporting a semiconductor device in a dry develop reactor and forming a carbon-based mask 15m over the semiconductor device. As illustrated in FIGS. 1a and 1b, the methods may also include forming an initial mask structure 20 on a carbon-based layer 15 and patterning the initial mask structure 20 to form exposed areas 18 and non-exposed areas 19 of the initial mask structure 20. The initial mask structure 20 may include a photomask 17 and one or more ARCs 16. The ARCs 16 may be an organic bottom antireflective coating (BARC) used alone, or in combination with, an inorganic ARC such as a silicon oxynitride, which may also be referred to as a dielectric antireflective coating (DARC).

Figure 3:
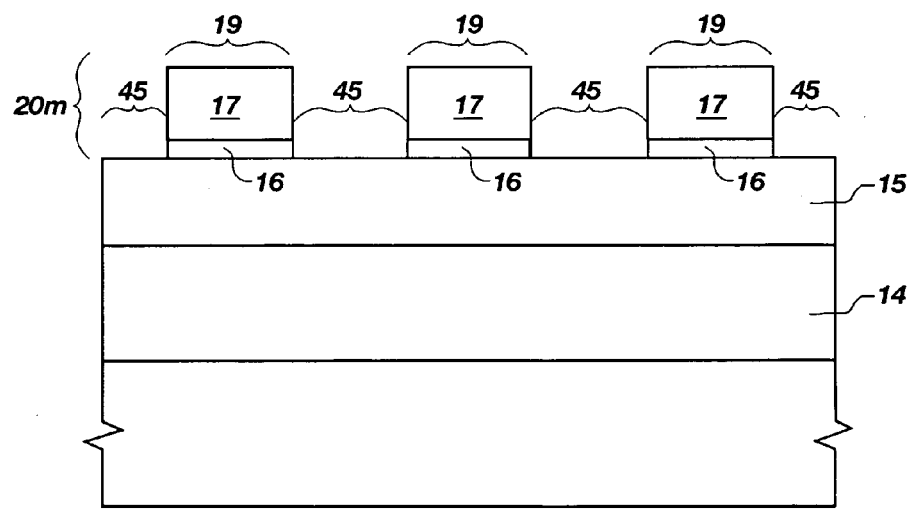
FIG. 3 illustrates a cross-sectional view taken from FIG. 2 following the removal of exposed areas of an anti-reflective coating with the non-exposed areas of the anti-reflective coating remaining.

Additionally, the methods of one aspect of the invention may include removing the exposed areas 18 of the initial mask structure 20 with an appropriate removal process in order to expose an area of the carbon-based layer 15, as shown in FIG. 3. The exposed area of the carbon-based layer 15 may be removed to form the carbon-based mask 15m (see, FIGS. 4 and 5a) using a dry develop process comprising supplying a gas including $O_2$, a gas including $SO_2$ and a gas including a hydrogen halide to the dry develop reactor. FIGS. 1a and 1b illustrate how initial structure 5 may be supported in a dry develop reactor 6. A carbon-based layer 15 may overlay the semiconductor device structure 30. An initial mask structure 20 may be formed over the carbon-based layer 15. The initial mask structure 20 may include exposed areas 18 and non-exposed areas 19.

In another particular aspect of the invention, a dry develop chemistry comprising $O_2$, $SO_2$ and HBr may be used to remove the exposed areas 18 of the carbon-based mask 15m to create openings 45 (see FIGS. 2-5b). The addition of HBr to the conventional $O_2$ and $SO_2$ dry develop chemistry enables a user to tune the critical dimension by growing and/or trimming the sidewalls 40. Moreover, the $O_2$, $SO_2$, HBr dry develop chemistry may be used to enhance passivation of sidewalls 40 and reduce bowing of sidewalls 40, thus improving the fidelity of the critical dimension and allowing fabrication of structures such as transistor gate structures with line widths equal to or less than 120 nm (see FIGS. 5a and 5b). Also, for purposes of example only and not as a limitation, the $O_2$, $SO_2$, HBr dry develop chemistry may be used to form features with extremely high aspect ratios (ratio of feature height to width) of up to 20:1 or 25:1 or even greater. Furthermore, the use of the $O_2$, $SO_2$, HBr dry develop chemistry allows for a higher etch rate and greater selectivity of the carbon-based layer 15.

Conventional dry develop chemistries containing $O_2$ and $SO_2$ without HBr often result in the lateral etching and bowing of sidewalls 40 and loss of the critical dimension. The term "critical dimension loss," as used herein, includes the erosion of feature dimensions during the etching process such as bowing of feature sidewalls and lateral etching of the overlying mask structure. This phenomenon is caused, at least in part, by the higher reactivity of alternate dry develop chemistries with reactants such as $O^-$, $Cl^-$, and $F^-$ that will etch the sidewall 40 without providing sufficient passivation of the sidewall 40. However, using the $O_2$, $SO_2$, HBr dry develop chemistry allows for a user to tune the profiles of sidewalls 40 and provides for passivation of sidewalls 40, thus limiting lateral etching and sidewall bowing typically exhibited by the use of dry develop chemistries without HBr.

Figure 4:
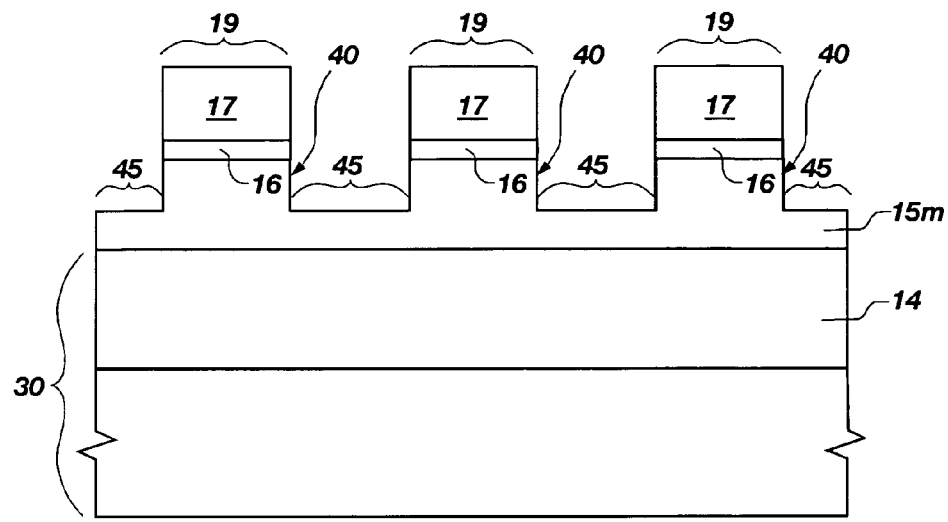
FIG. 4 illustrates a cross-sectional view taken from FIG. 3 following a partial removal of the exposed areas of a carbon-based mask.

Passivation of the carbon-based mask 15m, such as passivation of the sidewalls 40, occurs as the $Br^-$ ions react with the sidewalls 40 of the carbon-based mask 15m forming a passivation layer, such as a layer of $CBr_4$, on the surface of the sidewalls 40 (see, FIG. 4). The volatility of $CBr_4$ is less than the volatility of $CF_4$ and $CCl_4$ layers that may be formed with the use of alternate dry develop chemistries. Additionally, the $CBr_4$ passivation layer on the vertical sidewalls 40 of openings 45 is more resistant to removal by impinging ions from the dry develop chemistry than the more horizontal surfaces on the bottoms of openings 45. For example, without the $CBr_4$ passivation layer, $O^-$ ions would remove the sidewalls 40 along with the exposed areas at the bottom of openings 45 of the carbon-based mask. However, passivation of sidewalls 40 with the $O_2$, $SO_2$, HBr dry develop chemistry promotes selective etching of the carbon-based mask 15m on the bottoms of openings 45 (FIG. 4) while preserving the profiles of the sidewalls 40. Additionally, passivation of sidewalls 40 by $CBr_4$ improves the selectivity and resolution of subsequent etching of the underlying exposed areas of the semiconductor device structure 30.

Figure 2:
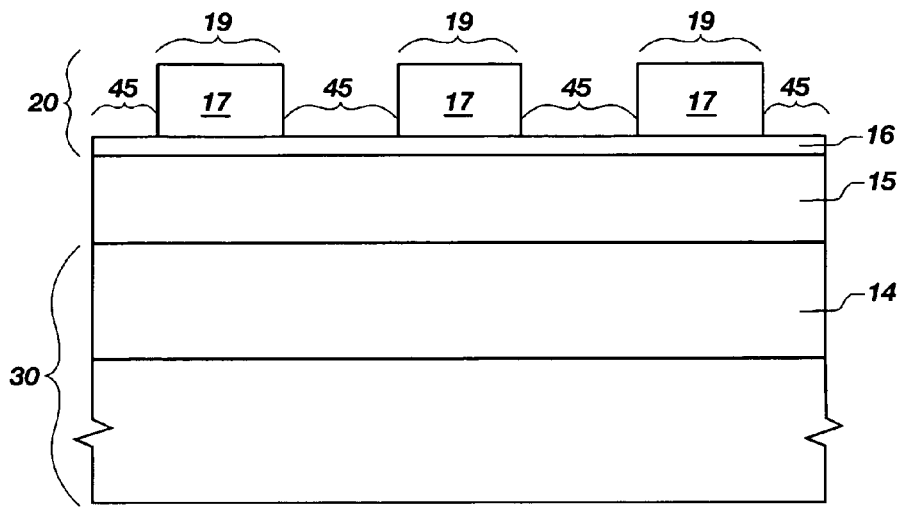
FIG. 2 illustrates a cross-sectional view taken from FIG. 1 following the removal of exposed photomask areas with the non-exposed photomask areas remaining.
Figure 5A:
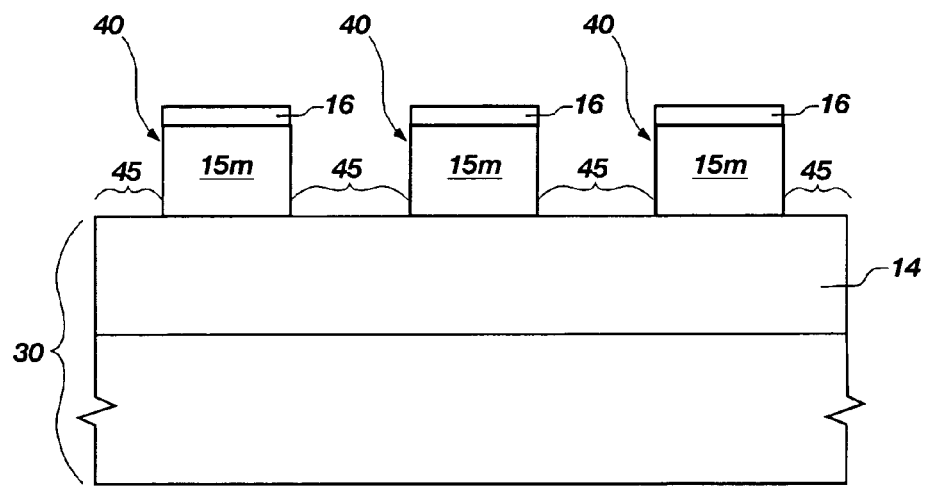
FIGS. 5a and 5b illustrate a cross-sectional view taken from FIG. 4 following a completed removal of the exposed areas of a carbon-based mask.
Figure 5B:
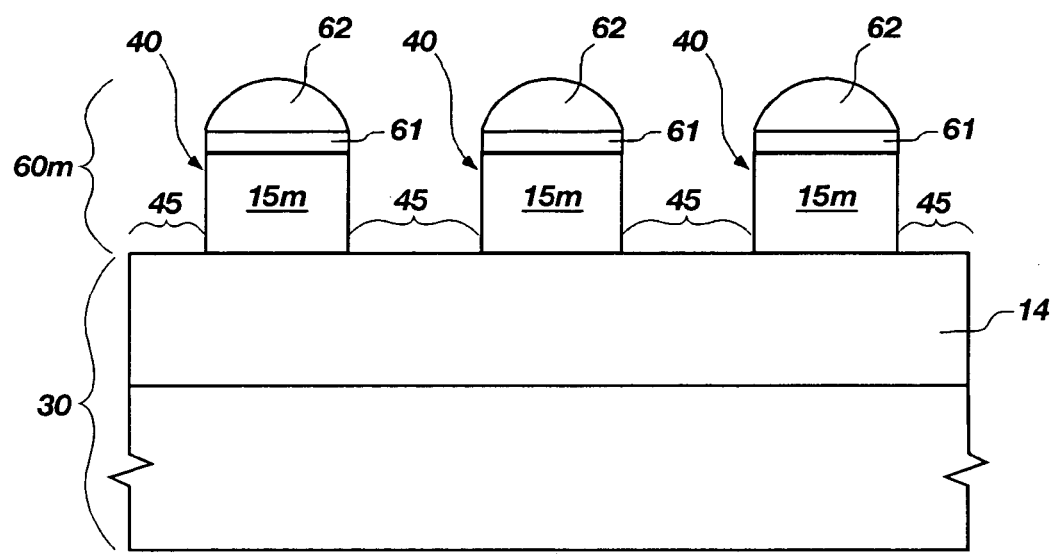

Examples of processes of the present invention may be carried out by a dry develop process run in a dry develop reactor or a plasma etch reactor, such as a Lam 2300 KIYO etcher (Lam Research Corporation, Fremont, Calif.). Furthermore, particular embodiments may use low or high density systems. According to one aspect of the invention, the dry develop process may begin with an initial structure 5 (FIGS. 1a and 1b) supported by a dry develop reactor 6. As known by those in the art, the dry develop process may proceed by energizing the dry develop chemistry gases into a plasma state and removing the exposed areas 18 of the initial mask structure 20. Referring to FIGS. 2-4, the dry develop process proceeds as the exposed areas 18 are removed from the initial mask structure 20 and the carbon-based mask 15m. As illustrated in FIGS. 5a and 5b, the dry develop process may proceed until the exposed areas 18 of the initial mask structure 20 and the carbon-based mask 15m are removed, thus, revealing the underlying semiconductor device structure 30 through the openings 45.

Referring to FIGS. 1a and 4, features may be formed in a carbon-based mask 15m while maintaining the critical dimension as patterned by an initial mask structure 20. The carbon-based layer 15 and the carbon-based mask 15m may include amorphous carbon or transparent carbon. Without limiting the scope of the present invention, the carbon-based layer 15 may have a thickness of about 1000 angstroms to about 7000 angstroms, although use of carbon-based masks of other suitable thickness are also within the scope of the present invention. The carbon-based layer 15 may be formed by a chemical vapor deposition (CVD) process or by other methods known in the art. The carbon-based layer 15 may be overlaid with an initial mask structure 20 that may comprise a patterned photomask 17 and one or more ARCs 16, such as a BARC or a DARC, or combinations thereof. The one or more ARCs 16 are conventionally used to provide better control of the photolithographic process wherein a pattern of exposed areas 18 and non-exposed areas 19 are created in the photomask 17 (FIGS. 1a and 2). The pattern in the photomask 17 may comprise an initial template for features of a semiconductor device structure 30. The patterned exposed areas 18 and non-exposed areas 19 of photomask 17 may also define the formation of openings 45 in the carbon-based mask 15m by a dry etch or a dry develop process (see, FIGS. 5a and 5b). The carbon-based mask 15m may be used to transfer the pattern of openings 45 to an underlying material layer 14 of semiconductor device structure 30. The initial mask structure 20 may be used to etch the carbon-based layer 15 directly or it may be a hard mask that may, in turn, be used to etch the carbon-based layer 15.

In another embodiment, an intermediate mask layer 60 may, for purposes of example only and not as a limitation of the present invention, comprise one or more oxide 61, polysilicon 62, oxide 63 hard mask layers (FIG. 1b) and may be deposited over a carbon-based layer 15. Referring to FIG. 5b, the polysilicon 62 or the oxide 61 may act as an etch-stop in forming the intermediate mask 60m. Also, the intermediate mask layer 60 may be a hard mask disposed between a photomask 65 and the carbon-based layer 15. As shown by FIG. 1b, a patterned photomask 65 may be deposited over the hard mask layers comprising oxide 61, polysilicon 62, and oxide 63 in order to pattern exposed areas 18 and non-exposed areas 19. The exposed areas 18 of the hard mask layers comprising oxide 61, polysilicon 62, oxide 63, exposed through apertures of the photomask 65, may be removed by an appropriate process to expose the underlying carbon-based layer 15. As shown by FIG. 5b, the exposed areas of the carbon-based layer 15 may then be removed by a dry etch process to form an intermediate mask 60m comprising a carbon-based mask 15m and the pattern of openings 45 to expose the underlying semiconductor device structure 30. Once a suitable initial mask structure 20m (FIG. 3) or an intermediate mask 60m (FIG. 5b) has been formed by known processes, a carbon-based mask 15m may be defined therewith.

The carbon-based mask 15m may be formed by dry etching a carbon-based material using an etch chemistry comprising $O_2$, $SO_2$, and HBr. Such a chemistry may be referred to as a dry develop process. As the dry develop process proceeds, as shown in FIGS. 2-4, the relative ratios of the gases may be adjusted in order to grow, trim or otherwise change the sidewall 40 profile of the opening 45 to maintain the desired critical dimension. For example, the flow rate of HBr may be increased to increase the growth rate of material deposition, whereas $O_2$ flow rate may be increased to enhance sidewall etching.

In another embodiment of the present invention, the $O_2$, $SO_2$, HBr dry develop chemistry may be used in processes for forming an intermediate hard mask that may provide for even greater dimensional control when forming a carbon-based mask from which one or more features of a semiconductor device are to be defined.

For purposes of example only and not by way of limitation of the present invention, the $O_2$, $SO_2$, HBr dry develop chemistry may be used for a so-called "pitch doubling" process during the formation of semiconductor devices. Pitch doubling is generally used to increase the number of features on a semiconductor device by making a mask with double the linear density that may conventionally be obtained with photolithographic processes.

During a pitch doubling process, an initial negative mask layer 50 (see, FIG. 15) may be formed over a carbon-based layer 15. With continued reference to FIG. 15, initial negative mask layer 50 may be formed by sequentially forming a hard mask layer 48 and a negative carbon-based layer 51 over the carbon-based layer 15 and a semiconductor device structure 30 that may be exposed through the carbon-based mask 15m. Hard mask layer 48 may comprise one or more layers of any material suitable for use as a hard mask, such as polysilicon, an oxide, a silicon nitride, a silicon oxynitride, a silicon carbide, SiCN, $Al_2O_3$, or the like. Hard mask layer 48 is employed as an etch stop and a hard mask for subsequent material removal processes. Initial negative mask layer 50 may comprise a negative carbon-based layer 51 made from transparent carbon (TC), amorphous carbon, or the like. Alternatively, one or more ARCs 49 may be formed over negative carbon-based layer 51. ARC 49 may comprise one or more BARC or DARC layers or a combination of BARC and DARC layers.

Figure 15:
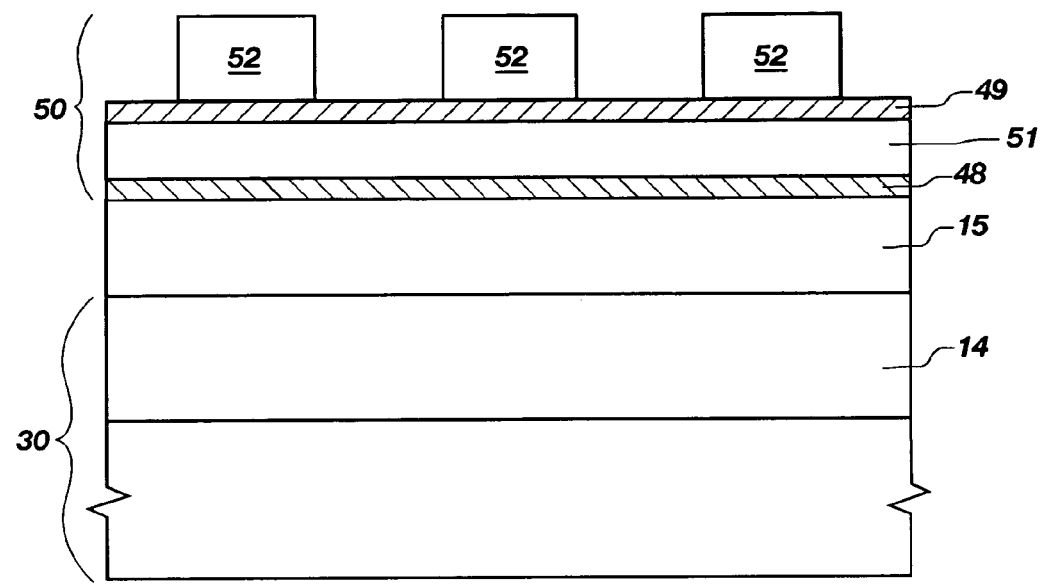
FIGS. 15-20 illustrate the fabrication of semiconductor device features while using a pitch-doubling process.
Figure 17:
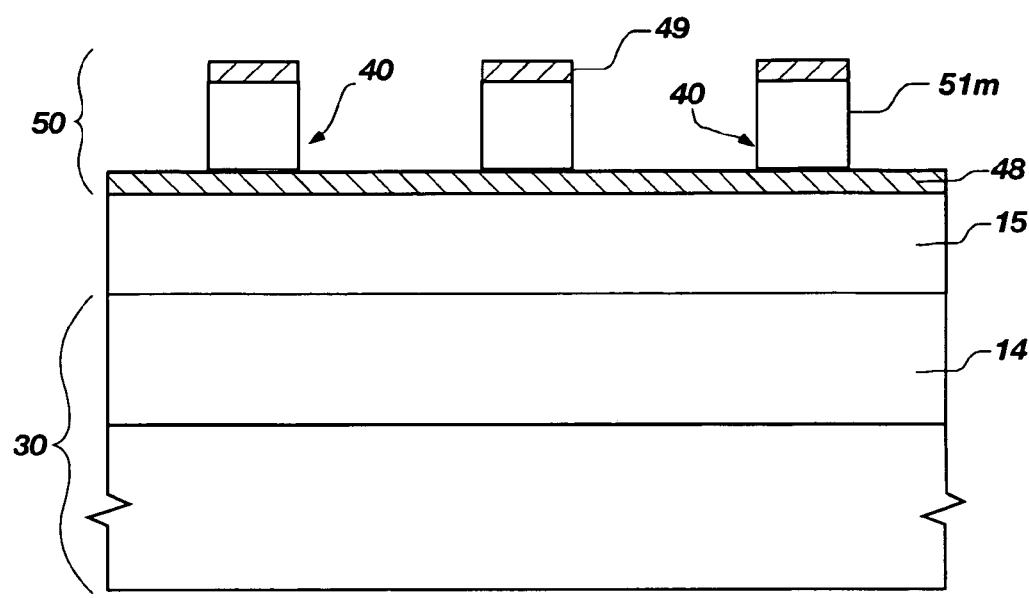

As shown in FIG. 15, a photomask 52 may be formed over initial negative mask layer 50 and negative carbon-based layer 51 as well as over other optional layers to facilitate patterning of one or more layers of hard mask layer 48 and the negative carbon-based mask 51m (FIG. 17). Photomask 52 may be applied and patterned by known processes.

Figure 16:
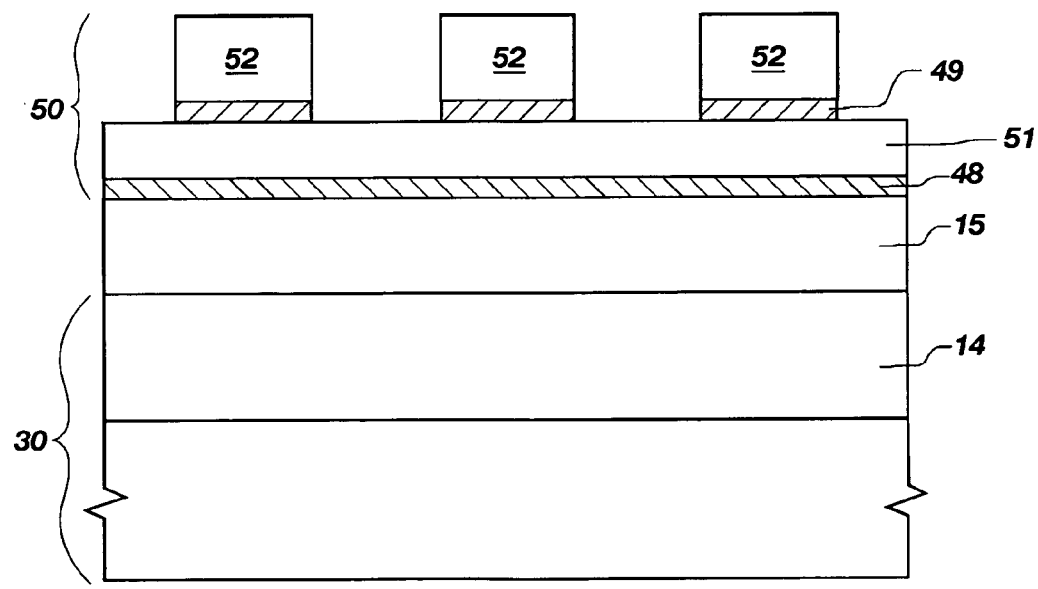

The general pattern of photomask 52 may be transferred to the underlying negative carbon-based layer 51 by etching the ARC 49, as illustrated in FIG. 16. Etching ARC 49 may also shrink the critical dimension of the photomask 52. Any suitable process, including, without limitation, known etching processes (e.g., dry develop processes, etc.), may be used to substantially transfer the pattern of photomask 52 to negative carbon-based layer 51.

The exposed areas of the negative carbon-based layer 51 may be removed using an $O_2$, $SO_2$, HBr dry develop chemistry process. The $O_2$, $SO_2$, HBr dry develop chemistry provides a high etch rate of the negative carbon-based layer 51 and high selectivity to the one or more ARCs 49 layer. Furthermore, the $O_2$, $SO_2$, HBr dry develop chemistry is superior to the typical $O_2$ and $SO_2$ chemistry because of the ability to tune and control the critical dimension and form vertical sidewalls 40 (FIG. 17). Hard mask layer 48 may act as an etch stop during the removal of the exposed negative carbon-based mask 51m.

Once an initial negative mask layer 50, comprising the negative carbon-based mask 51m, has been formed, any remnants of photomask 52 may be removed, as known in the art (e.g., with a suitable mask stripper) and shown in FIG. 17.

Figure 18:
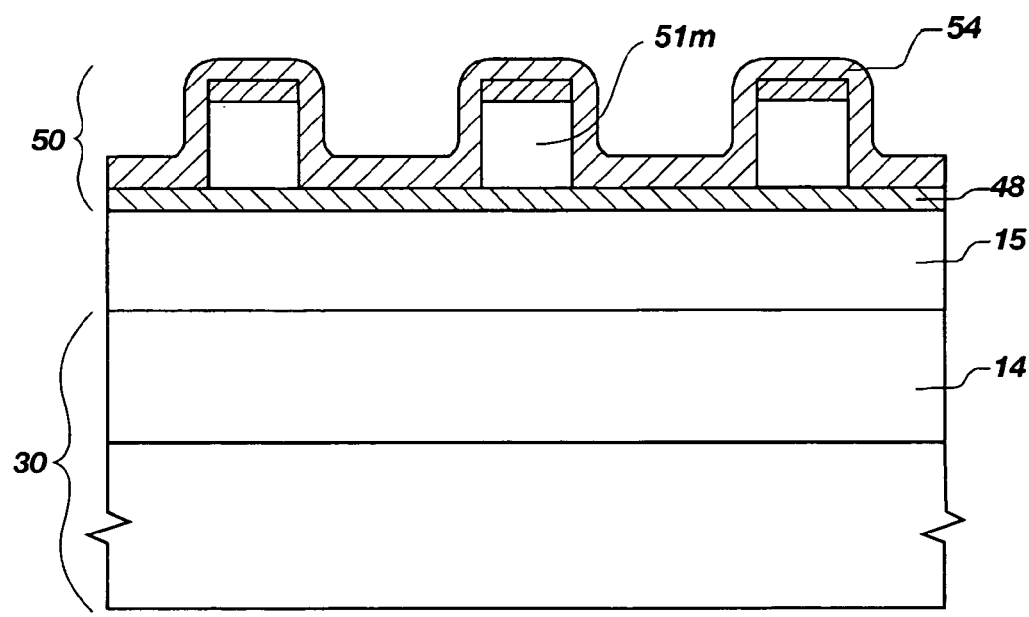

Next, as depicted in FIG. 18, an oxide layer 54 (e.g., doped or undoped silicon dioxide, etc.) is formed over the negative carbon-based mask 51m structure and portions of hard mask layer 48 that are exposed through the initial negative mask layer 50. Oxide layer 54 may be formed by any suitable process, including, but not limited to, deposition techniques, spin-on techniques, and the like.

Figure 19:
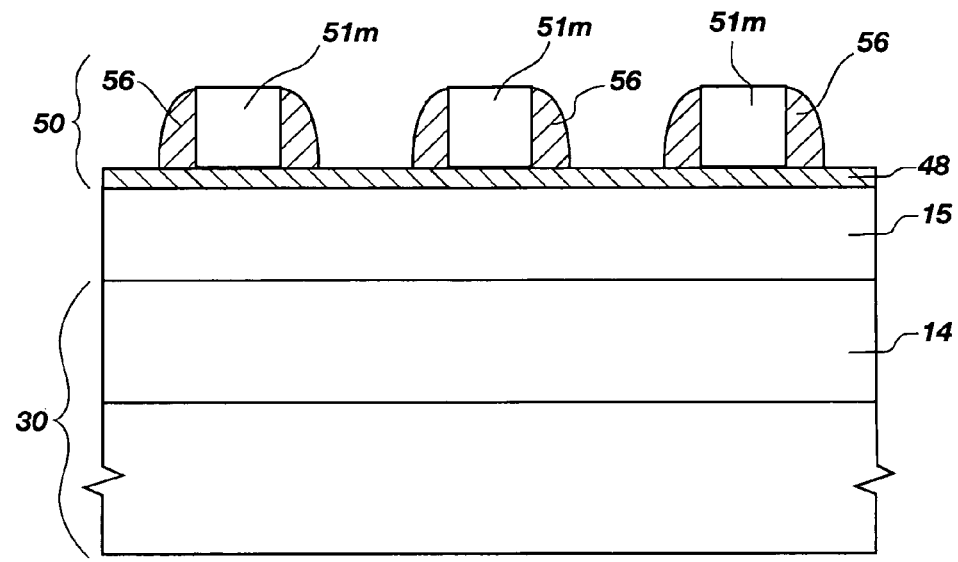

After oxide layer 54 is formed, a spacer etch may be conducted, as illustrated in FIG. 19. As familiar to those of ordinary skill in the art, a spacer etch is an anisotropic etch process. Hard mask layer 48 may act as an etch stop during the spacer etch process. The spacer etch process removes the relatively thin portions of oxide layer 54, including portions thereof that are located over the remaining regions of the negative carbon-based mask 51m, as well as portions of the oxide layer 54 that are located over the hard mask layer 48, between adjacent remaining regions of the negative carbon-based mask 51m. The thicker regions of oxide layer 54, which are adjacent to the lateral edges of the remaining regions of the negative carbon-based mask 51m, are not removed. The result is the spacer mask 56 as illustrated in FIG. 19.

Figure 20:
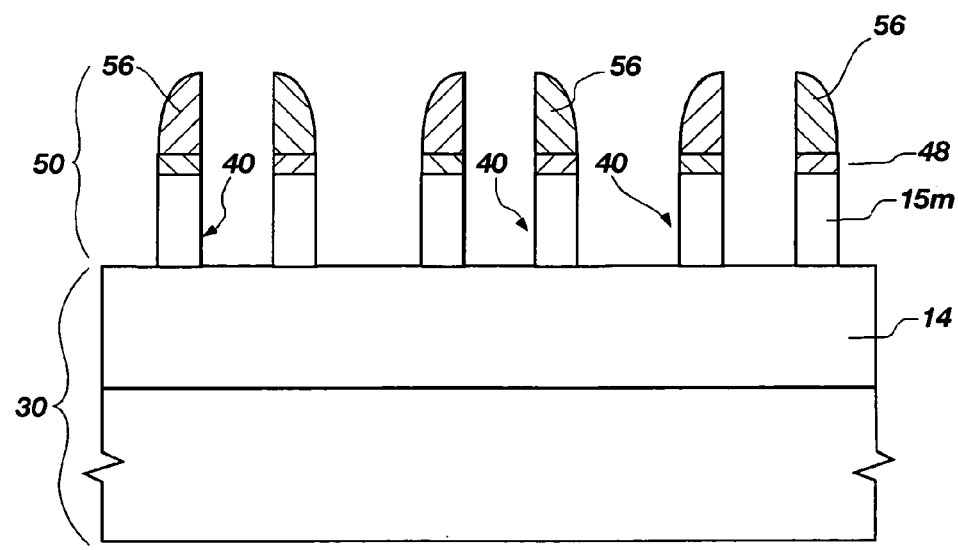

The remaining regions of the negative carbon-based mask 51m (FIG. 19), which are exposed through the spacer mask 56, are removed by suitable processes, as shown in FIG. 20. For example, the remaining regions of the negative carbon-based mask 51m may now be removed using a $O_2$, $SO_2$, HBr dry develop chemistry or other suitable etching process.

Thereafter, also as depicted in FIG. 20, regions of hard mask layer 48 that are exposed between portions of spacer mask 56 may be removed. The exposed portions of the underlying carbon-based layer 15 may be removed using an $O_2$, $SO_2$, HBr dry develop chemistry, as discussed previously, because of its high etch rate of the carbon-based layer 15 and the ability to trim and/or grow the critical dimension of the carbon-based layer 15. The carbon-based layer 15 and the carbon-based mask 15m may be made from transparent carbon, amorphous carbon, or the like. The remaining portions of hard mask layer 48, the overlying spacer mask 56 and the underlying carbon-based mask 15m collectively form a hard mask 58, through which patterning of the semiconductor device structure 30 and underlying structures may be effected (FIG. 20).

Figure 21:
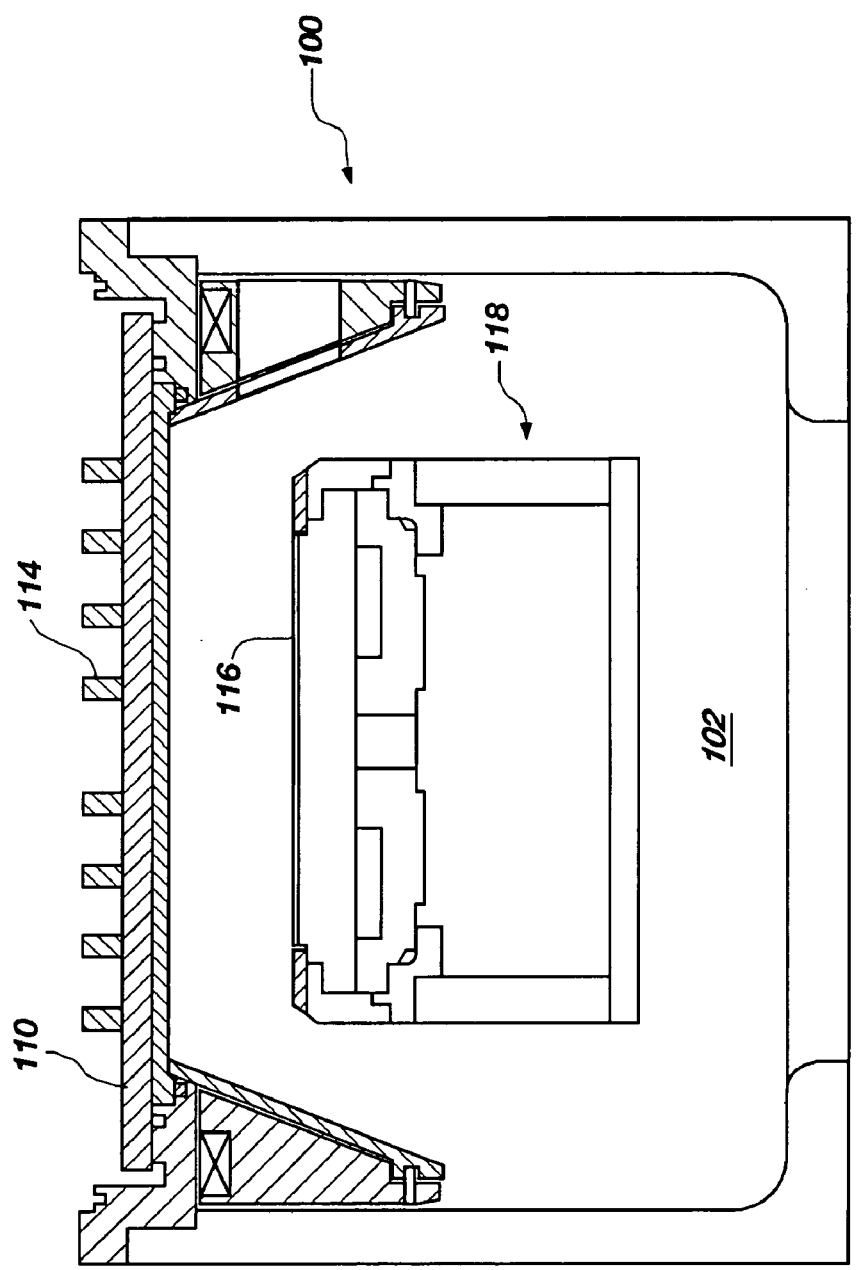
FIG. 21 is a schematic representation of a plasma reactor which may be used to carry out the processes of the invention.

In order to demonstrate the effects of the $O_2$, $SO_2$, HBr dry develop chemistry on the critical dimension of a carbon-based mask, tests were carried out in a chamber 102 of a Lam 623 dry etch reactor 100, schematically depicted in FIG. 21, with the temperature held at 40° C. inner and outer temperatures, and the pressure held at 5 mTorr. The dry etch reactor 100 includes a planar antenna 114 which inductively couples radio-frequency (RF) energy into the reactor through a dielectric window 110. A semiconductor substrate 116 is supported on a substrate support 118 which may include a bottom electrode for applying an RF bias to the semiconductor substrate 116. The test results are shown in TABLE 1 and FIG. 6. For TABLE 1 and FIG. 6, TCP represents the top power or the power in watts applied to the antenna 114, BP represents the bottom power or the power applied to the bottom electrode, the gas flow rates ($O_2$ Flow, $SO_2$ Flow, HBr Flow) are listed in units of standard cubic centimeters per minute (sccm), CD represents critical dimension measurement in nanometers (nm), CD bot-top represents the difference in critical dimension from the bottom to the top of the profile in nm and ER is the etch rate of the transparent carbon mask in angstroms per minute (Å/minute). FIGS. 7-14 are SEM cross-sections showing the critical dimension profiles of the wafers for each of the experiments 1-8, respectively, as described in TABLE 1.

Figure 7:
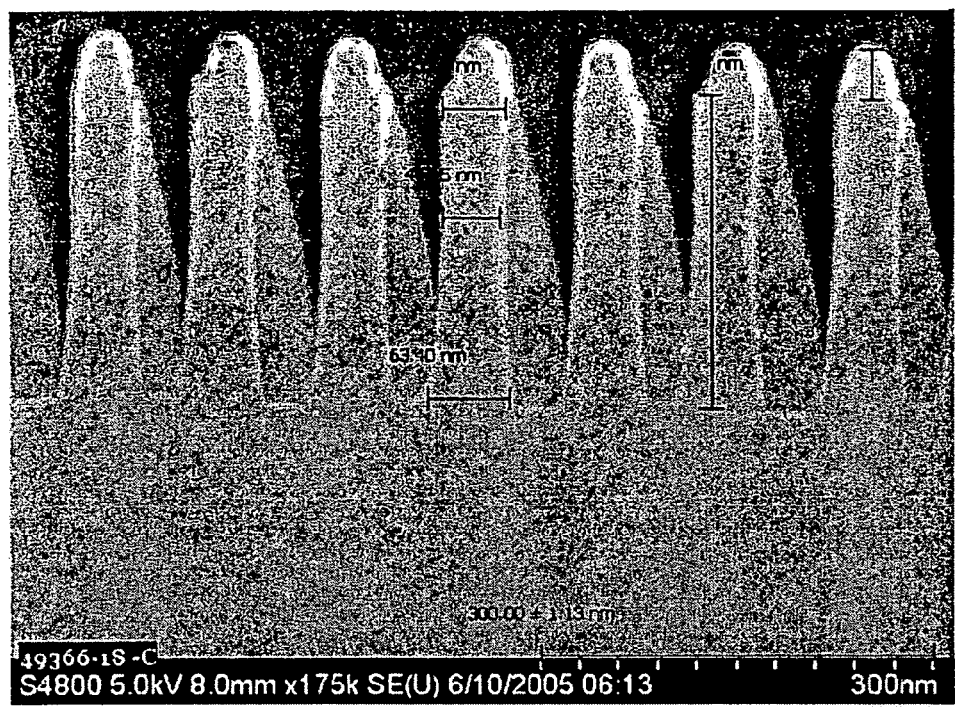
FIGS. 7-14 are scanning electron microscopy (SEM) cross-sections showing the critical dimension profiles of the wafers for each of the experiments 1-8.
Figure 8:
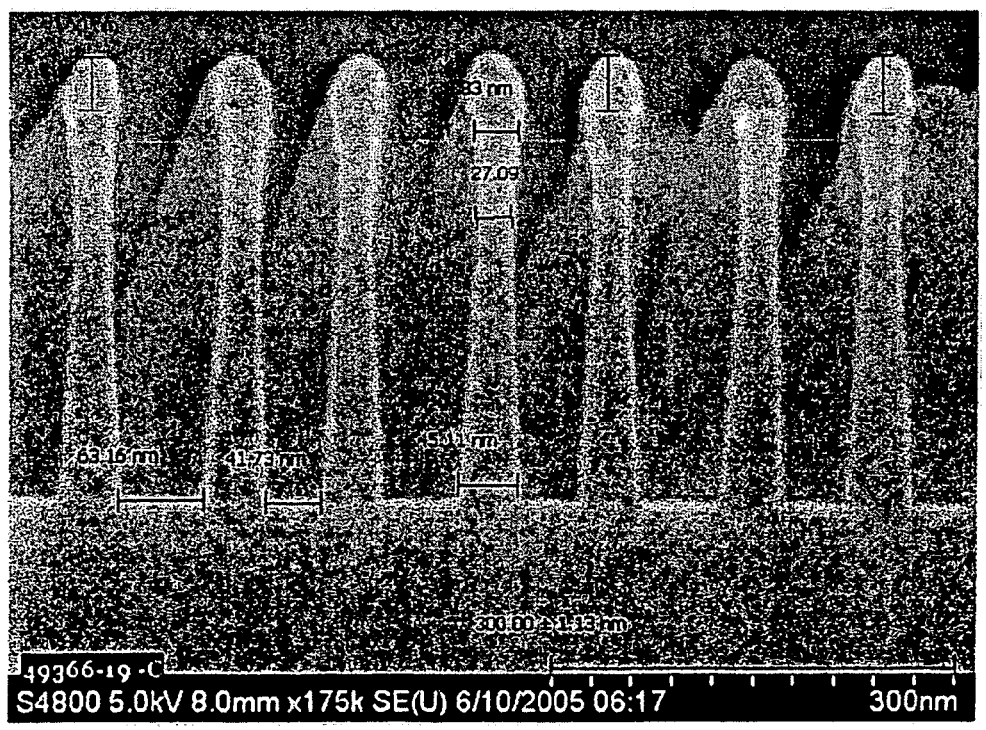
Figure 9:
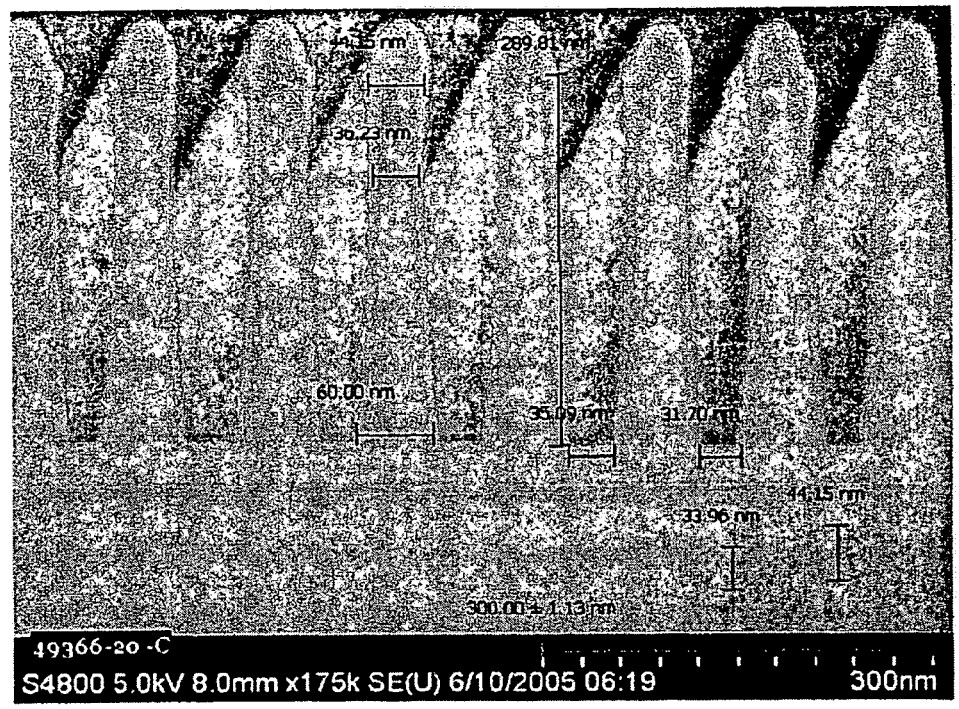
Figure 10:
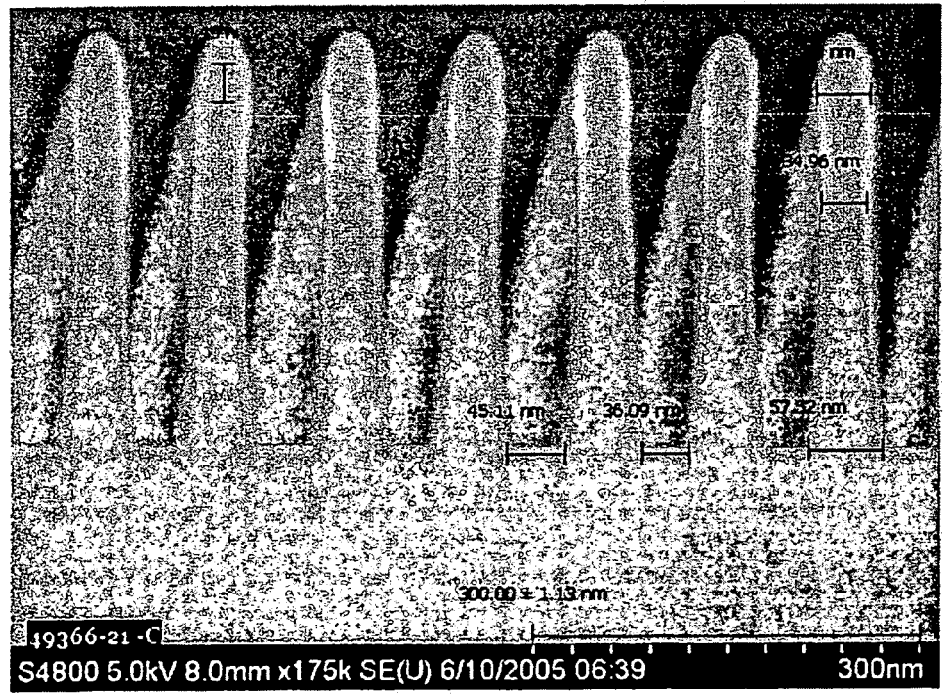
Figure 11:
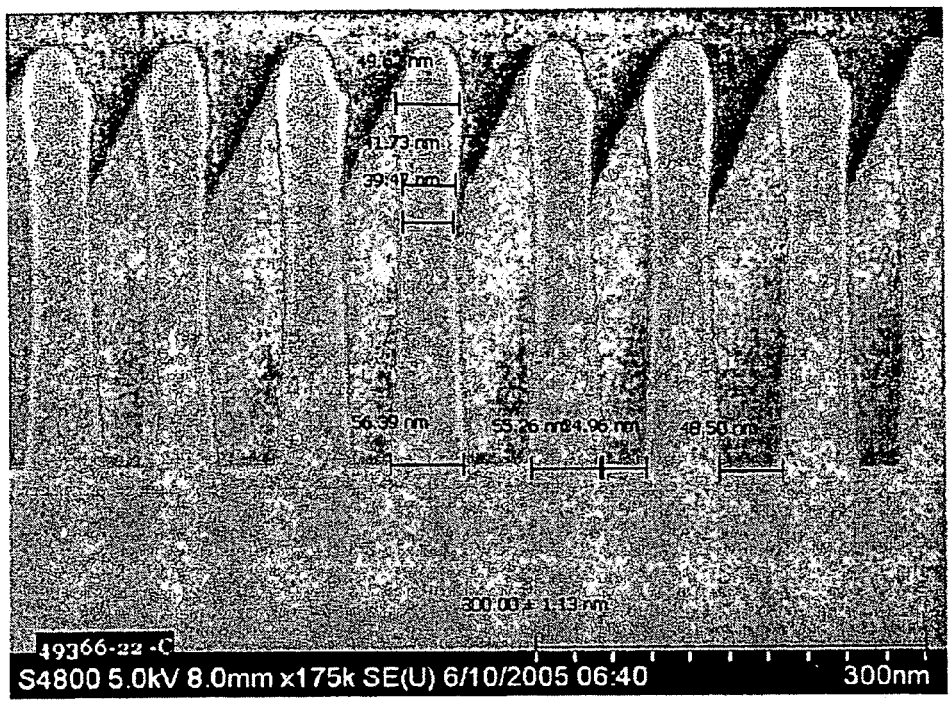
Figure 12:
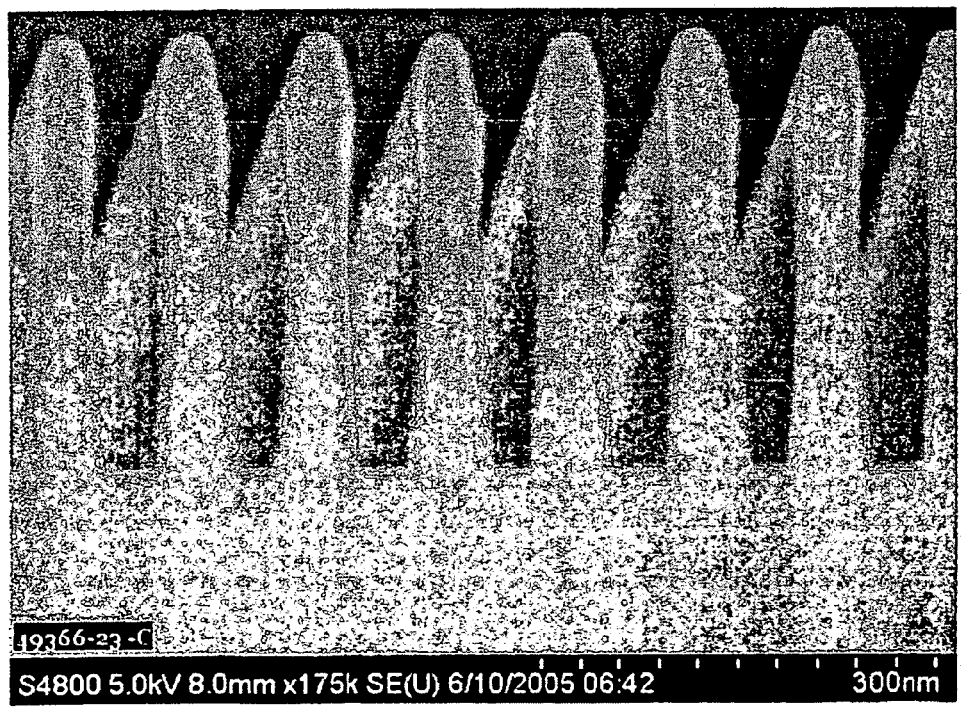
Figure 13:
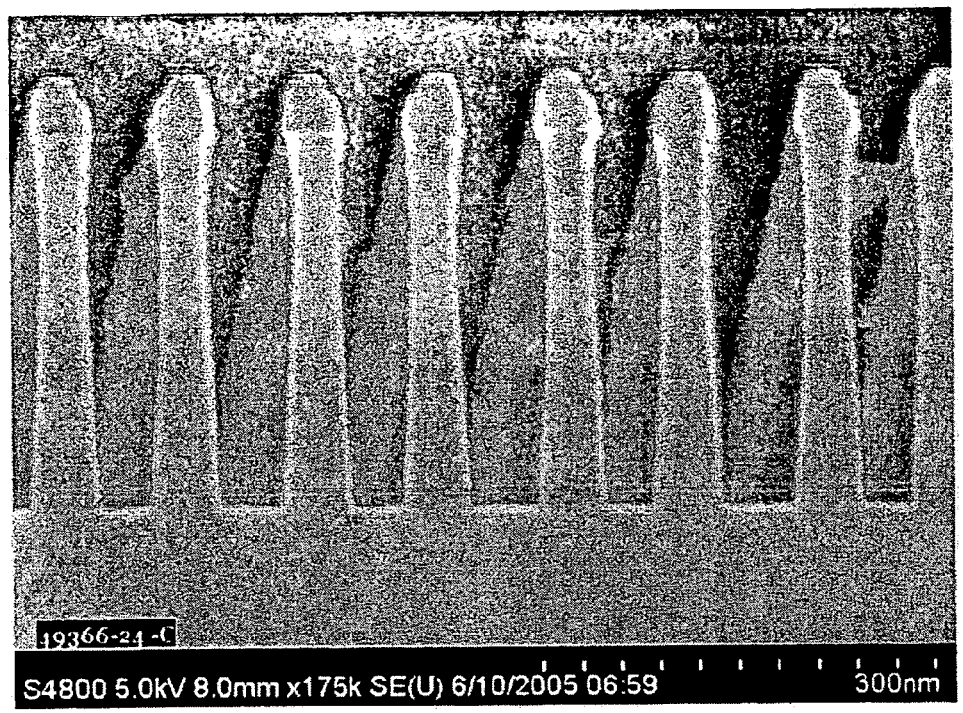
Figure 14:
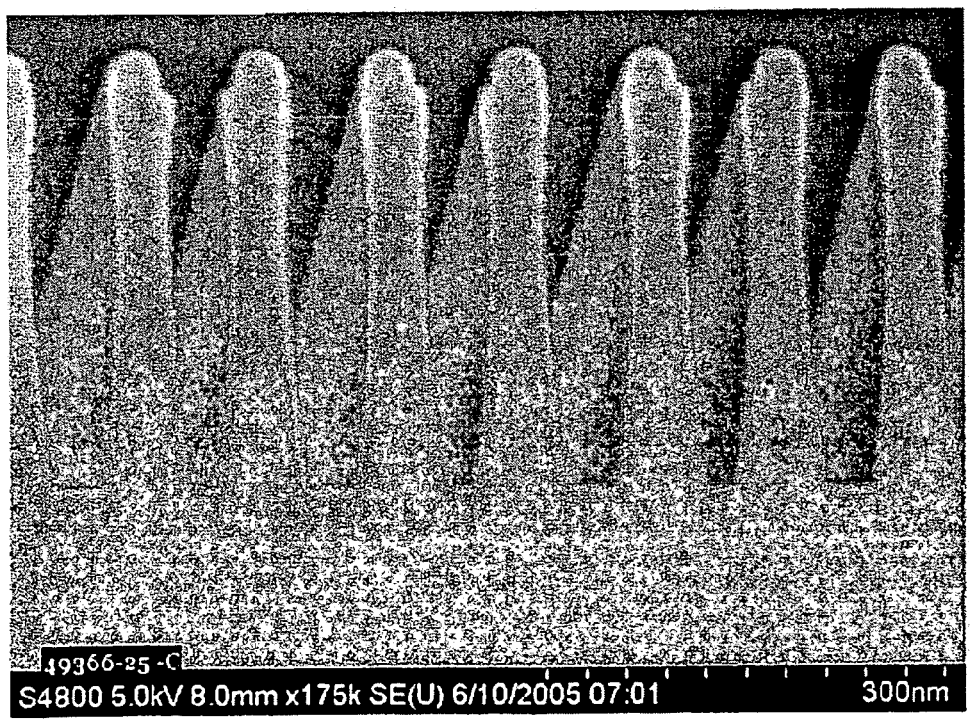

FIG. 7 is a SEM of experiment 1 showing the bottom (64.3 nm) and top (48.6 nm) measurements of the critical dimension for a feature in a carbon-based mask after using the $O_2$, $SO_2$, HBr dry develop chemistry. The conditions of experiment 1 are shown in TABLE 1. The SEM of FIG. 8 shows the results of experiment 2 (see, TABLE 1) and, when compared to FIG. 7, demonstrates how the critical dimension may be tuned by changing the conditions of the dry develop process. FIGS. 9-14 are SEMs corresponding to experiments 3-8 from TABLE 1, respectively, and illustrate the ability to tune the critical dimension by using different ratios of $O_2$, $SO_2$, and HBr during the dry develop process.

TABLE 1

| Experiment | Wafer | TCP | BP | $O_2$ | $SO_2$ | HBr | CD | CD bot-top | ER |
|---|---|---|---|---|---|---|---|---|---|
| 1 | 18 | 300 | 100 | 10 | 30 | 75 | 63.4 | 14.7 | 1154 |
| 2 | 19 | 500 | 100 | 30 | 30 | 25 | 45.1 | 11.3 | 2486 |
| 3 | 20 | 300 | 200 | 10 | 50 | 25 | 60 | 15.8 | 1740 |
| 4 | 21 | 500 | 200 | 10 | 30 | 25 | 57.5 | 15.8 | 2320 |
| 5 | 22 | 500 | 200 | 30 | 50 | 75 | 56.4 | 6.8 | 2677 |
| 6 | 23 | 300 | 200 | 30 | 30 | 75 | 60.2 | 10.2 | 1832 |
| 7 | 24 | 300 | 100 | 30 | 50 | 25 | 50.8 | 13.6 | 1740 |
| 8 | 25 | 500 | 100 | 10 | 50 | 75 | 65.7 | 15.9 | 1740 |

Figure 6:
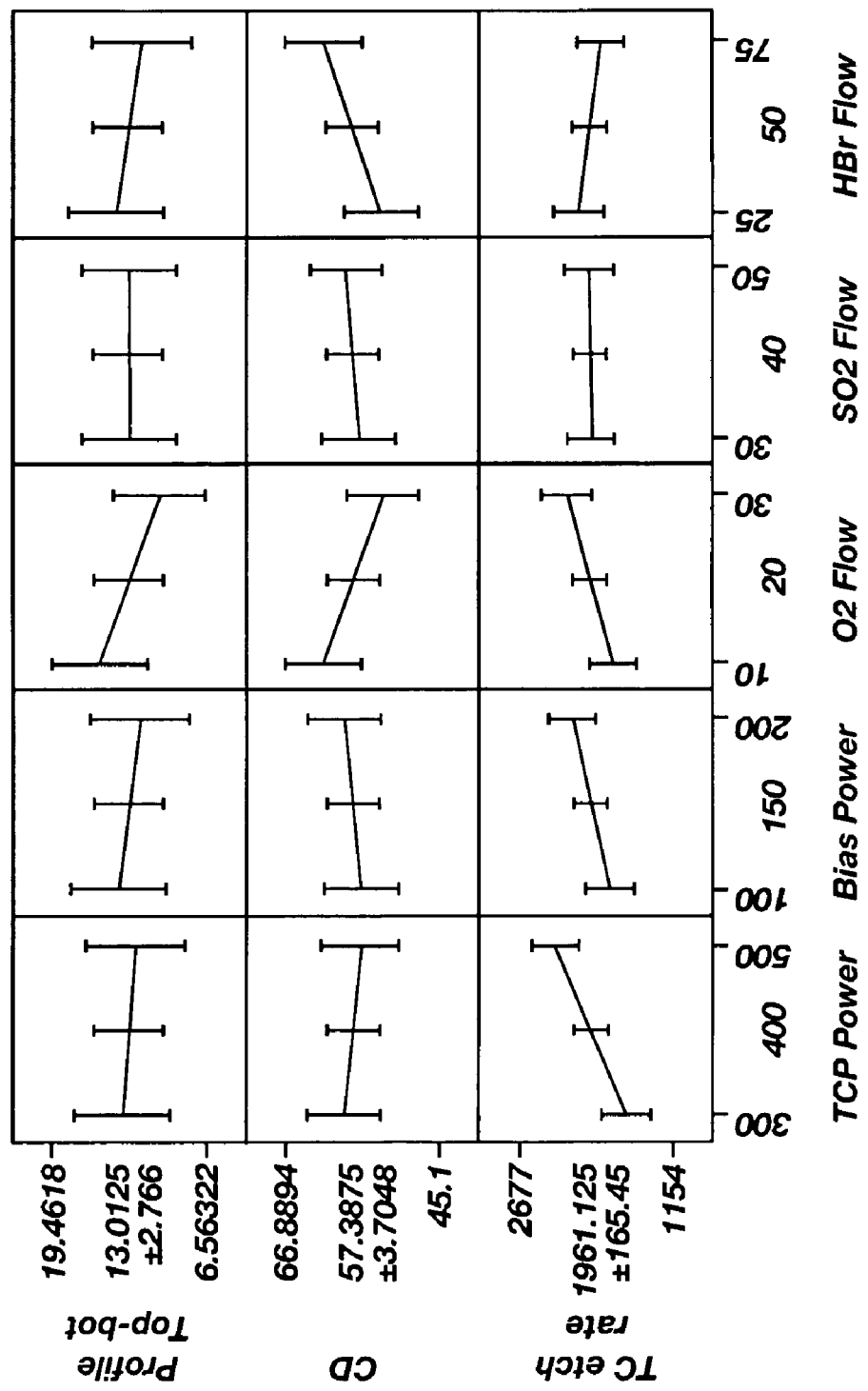
FIG. 6 shows compiled results from experiments 1-8.

As shown by TABLE 1 and FIG. 6, the test results indicate that as the gas flow rates for $O_2$, $SO_2$ and HBr are adjusted, the etch rate (ER), the critical dimensions (CD) of a carbon-based mask will also change. As such, the ER and the critical dimension, including the sidewall 40 profile, may be tuned and controlled by regulating the dry develop process conditions. For example, referring to TABLE 1, the maximum ER was achieved during experiment 5 with gas flow rates of $O_2$ at 30 sccm, $SO_2$ at 50 sccm, and HBr at 75 sccm. Referring to FIG. 6, the middle CD row, illustrating the changes in the critical dimension for different gas flow rates, it is evident, for example, that as the HBr flow rates increase, the critical dimension measurements or profile may also be changed.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from the spirit and scope of the invention as defined by the claims that follow.

What is claimed is:

1. A method of fabricating a semiconductor device comprising:
    forming a mask comprising carbon over a semiconductor device structure;
    forming a preliminary mask comprising photoresist over at least a portion of the mask; and
    exposing surfaces of the mask comprising carbon exposed through the preliminary mask comprising photoresist to a dry develop etch chemistry comprising $O_2$, $SO_2$, and at least one hydrogen halide to remove at least a portion of the mask comprising carbon and form at least one feature in the mask comprising carbon; and
    adjusting a ratio of the at least one hydrogen halide to the $O_2$ in the dry develop etch chemistry during exposure of the surfaces of the mask comprising carbon to control a critical dimension of the at least one feature in the mask comprising carbon.

2. The method of claim 1, wherein adjusting a ratio of the at least one hydrogen halide to the $O_2$ in the dry develop etch chemistry during exposure of the surfaces of the mask comprising carbon comprises adjusting at least one of a flow rate of the at least one hydrogen halide and a flow rate of the $O_2$.

3. The method of claim 1, wherein forming a preliminary mask comprising photoresist comprises forming a photomask over at least one antireflective coating.

4. The method of claim 3, wherein forming a photomask over at least one antireflective coating comprises forming the photomask over at least one of an organic bottom antireflective coating (BARC) and an inorganic dielectric antireflective coating (DARC).

5. The method of claim 1, wherein adjusting a ratio of the at least one hydrogen halide to the $O_2$ in the dry develop etch chemistry during exposure of the surfaces of the mask comprising carbon comprises controlling a relative flow rate of each of a gas comprising the $O_2$, a gas comprising the $SO_2$, and a passivating gas consisting of the at least one hydrogen halide to tune the critical dimension of the at least one feature in the mask comprising carbon during the removal of material from the mask comprising carbon.

6. The method of claim 1, wherein exposing surfaces of the mask comprising carbon exposed through the preliminary mask comprising photoresist to a dry develop etch chemistry comprising $O_2$, $SO_2$, and at least one hydrogen halide comprises exposing surfaces of the mask comprising carbon exposed through the preliminary mask comprising photoresist to a dry develop etch chemistry comprising $O_2$, $SO_2$, and HBr.

7. The method of claim 1, wherein exposing surfaces of the mask comprising carbon exposed through the preliminary mask comprising photoresist to a dry develop etch chemistry comprising $O_2$, $SO_2$, and at least one hydrogen halide comprises introducing a gas comprising the $O_2$ into a chamber at a flow rate of from about 10 sccm to about 30 sccm, introducing a gas comprising the $SO_2$ into the chamber at a flow rate of from about 30 sccm to about 50 sccm, and introducing HBr into the chamber at a flow rate of from about 25 sccm to about 75 sccm.

8. A method of forming an opening in a mask comprising:
forming a mask comprising carbon;
forming a preliminary mask comprising photoresist over the mask comprising carbon;
exposing at least one area of the mask comprising carbon exposed through the preliminary mask comprising photoresist to a gaseous reactive species derived from $O_2$ and $SO_2$ to form at least one opening in the mask comprising carbon;
exposing the at least one opening formed in the mask comprising carbon to a gaseous passivating species derived from HBr to form a passivation material comprising $CBr_4$ on at least one surface of the at least one opening; and
adjusting a concentration of the gaseous passivating species with respect to the gaseous reactive species during exposure of the at least one opening formed in the mask comprising carbon to control a critical dimension of the at least one opening.

9. The method of claim 8, wherein exposing at least one area of the mask comprising carbon exposed through the preliminary mask comprising photoresist to a gaseous reactive species derived from $O_2$ and $SO_2$ to form at least one opening in the mask comprising carbon comprises exposing the at least one area of the mask comprising carbon exposed through the preliminary mask comprising photoresist to the gaseous reactive species derived from the $O_2$ and the $SO_2$ to form at least one opening having a width of less than or equal to about 120 nanometers.

10. The method of claim 8, wherein exposing the at least one opening formed in the mask comprising carbon to a gaseous passivating species derived from HBr comprises forming the passivation material comprising the $CBr_4$ on surfaces of sidewalls of the at least one opening.

11. The method of claim 8, wherein forming a mask comprising carbon comprises forming a mask comprising carbon having a thickness of between 1000 angstroms and 7000 angstroms.

12. A method of tuning at least one critical dimension of a feature of a mask comprising:
forming a mask comprising carbon over a semiconductor device structure;
forming a preliminary mask over the mask;
exposing at least one area of the mask comprising carbon exposed through the preliminary mask to a dry etch chemistry comprising $O_2$, $SO_2$, and a hydrogen halide to remove material from the mask comprising carbon to form at least one feature in the mask comprising carbon; and
changing a concentration of the hydrogen halide in the dry etch chemistry during exposure of the at least one area of the mask comprising carbon to tune a critical dimension of the at least one feature in the mask comprising carbon.

13. The method of claim 12, wherein exposing at least one area of the mask comprising carbon exposed through the preliminary mask to a dry etch chemistry comprising $O_2$, $SO_2$, and a hydrogen halide comprises introducing a gas comprising the $O_2$, a gas comprising the $SO_2$, and a gas comprising HBr into a chamber, each of the gas comprising the $O_2$ and the gas comprising the $SO_2$ introduced at a flow rate less than a flow rate of the gas comprising the HBr.

14. The method of claim 12, wherein exposing at least one area of the mask comprising carbon exposed through the preliminary mask to a dry etch chemistry comprising $O_2$, $SO_2$, and a hydrogen halide comprises introducing a gas comprising the $O_2$ into a chamber at from about 10 sccm to about 30 sccm, introducing a gas comprising the $SO_2$ into the chamber at about 30 sccm to about 50 sccm, and introducing a passivating gas consisting of the at least one hydrogen halide into the chamber at about 25 sccm to about 75 sccm.

15. The method of claim 12, wherein changing a concentration of the hydrogen halide in the dry etch chemistry during exposure of the at least one area of the mask comprising carbon comprises adjusting a rate at which material is removed from the mask comprising carbon.

16. A method of fabricating a semiconductor device comprising:
forming a mask comprising carbon over a semiconductor device structure;
forming a negative mask over the mask comprising carbon;
forming a photomask over the negative mask;
removing at least one area of the negative mask exposed through the photomask;
forming a spacer mask over the mask;
removing at least one area of the negative mask exposed through the spacer mask;
exposing at least one area of the mask comprising carbon exposed through the spacer mask to a gaseous reactive species derived from $O_2$ and $SO_2$ to remove material from the mask comprising carbon to form a recess therein;
exposing the recess formed at the at least one area of the mask comprising carbon to a gaseous passivating species derived from at least one hydrogen halide to form a passivation material on a surface of the recess; and
adjusting a ratio of the gaseous passivating species derived from the at least one hydrogen halide to the gaseous reactive species derived from $O_2$ and $SO_2$ during exposure of the recess formed at the at least one area of the mask comprising carbon to control a critical dimension of the recess in the mask comprising carbon.

17. The method of claim 16, wherein forming a negative mask over the mask comprising carbon comprises forming a negative mask comprising at least one of amorphous carbon and transparent carbon over a hard mask overlying the mask comprising carbon.

18. The method of claim 16, wherein removing at least one area of the negative mask exposed through the photomask comprises exposing the at least one area of the negative mask to the gaseous reactive species derived from at least the $O_2$ and the $SO_2$ to form an opening therein and exposing the opening formed at the at least one area of the negative mask to the gaseous passivating species to form the passivation material on a surface of the opening.

19. The method of claim 18, wherein exposing the opening formed at the at least one area of the negative mask to the gaseous passivating species to form the passivation material on a surface of the opening comprises exposing the opening formed at the at least one area of the negative mask to a gaseous passivating species derived from HBr to form a passivation material consisting of $CBr_4$ on sidewalls of the opening.

20. The method of claim 16, wherein adjusting a ratio of the gaseous passivating species derived from the at least one hydrogen halide to the gaseous reactive species derived from $O_2$ and $SO_2$ during exposure of the recess formed at the at least one area of the mask comprising carbon to control a critical dimension of the recess in the mask comprising carbon comprises controlling a flow rate of a gaseous passivating gas consisting of HBr to tune the critical dimension of the recess in the mask comprising carbon during the removal of material from the mask comprising carbon.

21. The method of claim 20, wherein:
exposing at least one area of the mask comprising carbon exposed through the spacer mask to a gaseous reactive species derived from $O_2$ and $SO_2$ comprises introducing a gas comprising the $O_2$ into a chamber at a flow rate of from about 10 sccm to about 30 sccm and introducing a gas comprising the $SO_2$ into the chamber at a flow rate of from about 30 sccm to about 50 sccm; and
exposing the recess formed at the at least one area of the mask comprising carbon to a gaseous passivating species derived from at least one hydrogen halide comprises introducing a gas consisting of the least one hydrogen halide into the chamber at a flow rate of from about 25 sccm to about 75 sccm.

22. The method of claim 16, wherein exposing the recess formed at the at least one area of the mask comprising carbon to a gaseous passivating species derived from at least one hydrogen halide comprises exposing the recess formed at the at least one area of the mask comprising carbon to a gaseous passivating species derived from a passivating gas consisting of HBr.

23. The method of claim 22, wherein exposing the recess formed at the at least one area of the mask comprising carbon to a gaseous passivating species derived from a passivating gas consisting of HBr comprises controlling a flow rate of the passivating gas to tune the critical dimension of the recess formed at the at least one area of the mask comprising carbon during the removal of material from the mask comprising carbon.

24. The method of claim 23, wherein:
exposing the at least one area of the mask comprising carbon exposed through the spacer mask to a gaseous reactive species derived from $O_2$ and $SO_2$ comprises introducing a gas comprising the $O_2$ into a chamber at a flow rate of from about 10 sccm to about 30 sccm and introducing a gas comprising the $SO_2$ at a flow rate of from about 30 sccm to about 50 sccm; and
controlling a flow rate of the passivating gas comprises introducing the passivating gas into the chamber at a flow rate of from about 25 sccm to about 75 sccm.

25. The method of claim 16, wherein forming a photomask over the negative mask comprises forming the photomask over an antireflective coating overlying the negative mask.

26. A method of fabricating a semiconductor device comprising:
forming a mask comprising carbon over a semiconductor device structure;
forming a preliminary mask comprising an oxide, polysilicon, and oxide hard mask over the mask comprising carbon;
forming a photomask over the preliminary mask;
removing at least one area of the preliminary mask exposed through the photomask;
exposing at least one area of the mask comprising carbon exposed through the preliminary mask to a dry etch chemistry comprising $O_2$, $SO_2$, and a hydrogen halide to remove at least a portion of the mask comprising carbon, forming at least one feature in the mask comprising carbon; and
adjusting a concentration of the hydrogen halide in the dry etch chemistry during exposure of the at least one area of the mask comprising carbon to control a critical dimension of the at least one feature in the mask comprising carbon.

27. The method of claim 26, wherein exposing at least one area of the mask comprising carbon exposed through the preliminary mask to a dry etch chemistry comprising $O_2$, $SO_2$, and a hydrogen halide comprises exposing the at least one area of the mask comprising carbon exposed through the preliminary mask to a dry etch chemistry comprising $O_2$, $SO_2$, and HBr.

28. The method of claim 27, wherein adjusting a concentration of the hydrogen halide in the dry etch chemistry during exposure of the at least one area of the mask comprising carbon to control a critical dimension of the at least one feature in the mask comprising carbon comprises controlling a flow rate of a passivating gas consisting of HBr to tune the critical dimension of the at least one feature in the mask comprising carbon during the removal of material from the mask comprising carbon.

29. The method of claim 28, wherein controlling a flow rate of a passivating gas comprises introducing the passivating gas into a chamber at a flow rate of from about 25 sccm to about 75 sccm.

\* \* \* \* \*